(12) United States Patent
Cavaleri et al.

(10) Patent No.: US 6,965,526 B2
(45) Date of Patent: Nov. 15, 2005

(54) SECTORED FLASH MEMORY COMPRISING MEANS FOR CONTROLLING AND FOR REFRESHING MEMORY CELLS

(75) Inventors: Paola Cavaleri, Rousset (FR); Bruno Leconte, Rousset (FR); Sebastien Zink, Aix en Provence (FR)

(73) Assignee: STMicroelectronics SA., Montrouge (FR)

( * ) Notice: Subject to any disclaimer, the term of this patent is extended or adjusted under 35 U.S.C. 154(b) by 54 days.

(21) Appl. No.: 10/775,032

(22) Filed: Feb. 9, 2004

(65) Prior Publication Data

US 2004/0213035 A1 Oct. 28, 2004

(30) Foreign Application Priority Data

Feb. 10, 2003 (FR) .............................. 03 01558

(51) Int. Cl.[7] .............................................. G11C 16/04
(52) U.S. Cl. .............. 365/185.29; 365/236; 365/185.33
(58) Field of Search ............................ 365/185.29, 236, 365/185.33, 222, 238.5

(56) References Cited

U.S. PATENT DOCUMENTS 5,386,533 A    1/1995  Morris ....................... 395/425
6,005,810 A  * 12/1999  Wu ......................... 365/185.33
6,345,001 B1   2/2002  Mokhlesi ................ 365/185.33

FOREIGN PATENT DOCUMENTS

| EP | 1 233 421 A1 | 8/2002 |
| FR | 2 810 152 A1 | 12/2001 |
| FR | 2 816 751 A1 | 5/2002 |

\* cited by examiner

Primary Examiner—David Lam
(74) Attorney, Agent, or Firm—Lisa K. Jorgenson; David V. Carlson; Seed IP Law Group PLLC (57) ABSTRACT

The present invention relates to a method for controlling and for refreshing memory cells in an electrically erasable and programmable memory comprising a memory array organized in sectors, each sector comprising memory cells linked to bit lines and to word lines. The method comprises controlling and refreshing memory cells of pages of the memory array the address of which is indicated by a control and refresh counter comprising data forming tokens usable once. According to the present invention, a control and refresh counter is integrated into each sector of the memory and comprises memory cells linked to the bit lines of the sector. A counter of a sector is erased after reaching a maximum counting value that is chosen so that, when this maximum counting value is reached, memory cells of the counter have undergone a number of electrical stress cycles that is at the most equal to a determined number. Application to Flash memories.

18 Claims, 3 Drawing Sheets

SECTORED FLASH MEMORY COMPRISING MEANS FOR CONTROLLING AND FOR REFRESHING MEMORY CELLS

BACKGROUND OF THE INVENTION

1. Field of the Invention

The present invention relates to Flash memories comprising a memory array organized in sectors.

The present invention relates more particularly to a page-erasable Flash memory of the type described by international application WO 02/41322, comprising a non-volatile counter dedicated to controlling and to refreshing the pages of the memory array;

2. Description of the Related Art

As expounded in the above-mentioned international application, a page-programmable Flash memory having a considerable storage capacity must comprise means for controlling and for refreshing also called reprogramming its memory cells, if each page of the memory is to be able to be erased and programmed a considerable amount of times.

Indeed, a programming operation of a memory cell comprises the application, to one bit line to which the memory cell is linked, of a programming voltage Vpp of high value. Now, in a Flash memory, the memory cells comprise floating-gate transistors that are directly connected to the bit lines of the memory array, without the intermediary of an access transistor (as is the case in EEPROM memories). As a result, all the memory cells linked to the bit line of a memory cell being programmed receive the voltage Vpp. This leads to an electrical stress phenomenon also called programming stress or drain stress, that can eventually cause a spurious erasure of the memory cells that are in the programmed state.

Therefore, if the user is given the possibility of reprogramming Z times the same page in a sector of Flash memory comprising X1 word lines (or pages), the maximum number CMAX1 of electrical stress cycles endured by the memory cells is equal to:

$$CMAX1 = (X1-1)*Z \qquad (1)$$

when each of the X1−1 other pages of the sector is programmed Z times.

In these conditions, the maximum time TMAX1 of electrical stress endured by the memory cells of one page is equal to:

$$TMAX1 = (X1-1)*Z*Tp \qquad (2)$$

Tp being the programming time of one memory cell, during which the memory cells belonging to pages other than the one being programmed but connected to the same bit line, undergo the programming voltage Vpp. For a sector of 512 Kbits comprising 256 word lines and 256 columns of eight bits each (i.e. 256 words or 2,048 bits per page), and for an authorized number Z of reprogramming operations equal to $10^5$ and a programming time Tp of 5 µs, the maximum time of electrical stress that a memory cell can undergo is in the order of 128 seconds, i.e., a considerable electrical stress.

In the above-mentioned international application, the proposal is to control, after R cycles of programming the pages of a memory, the memory cells of K pages of the memory array. This control operation comprises a double read of the bytes of the page, with different read voltages, aiming to determine whether the threshold voltage Vth of the floating-gate transistors is or is not within a range of values considered to be normal. If the results of the two reads are not identical, that means that memory cells have been altered. The defective memory cells are then refreshed, that is reprogrammed.

Thanks to this method, the maximum number of electrical stress cycles CMAX2 and the maximum time TMAX2 of electrical stress that a memory cell can undergo are reduced to the following values:

$$CMAX2 = X1*R/K. \qquad (3)$$

$$TMAX2 = X1*R/K*Tp. \qquad (4)$$

When R and K are equal to 1 (preferred embodiment), one page is controlled after each programming operation of a page, i.e.:

$$CMAX2 = X1. \qquad (5)$$

$$TMAX2 = X1*Tp. \qquad (6)$$

To implement this method, the above-mentioned international application also proposes managing the addresses of the pages to be controlled by means of a non-volatile counter that is incremented after each control of a page. This counter allows all the pages of the memory array to be controlled cyclically by returning to the first page thanks to an erasure of the counter, after reaching the last page address. It will be noted here that in the formulae (3) to (6), the term X1 must be replaced by the term "X1−1" if a page designated by the counter is refreshed before a page is programmed, instead of after a page has been programmed.

The provision of this counter poses the problem of the service life of the memory cells of the counter itself. Indeed, memory cells are authorized to be erased and reprogrammed Z times, such as 100,000 times, for example. Now, if the counter is erased and reprogrammed with a value incremented after each control of a page, and if a page designated by the counter is controlled after each programming operation of a page, the number of cycles of erasing or programming the memory cells of the counter is equal to X1*Z, i.e., a number of cycles that clearly exceeds the authorized limit.

To solve this problem, the above-mentioned international application proposes a method for managing the counter according to which a memory cell in the programmed state corresponds to one used token that cannot be reused while the counter has not been erased. The address of the page to be controlled is thus determined by the rank in the counter of the first usable token (erased cell) that is encountered by reading the counter according to a determined read direction. When all the tokens of the counter are used (programmed cells), the counter is erased and the counting starts again from the first token.

Another constraint linked to the provision of this counter is linked to the substantial electrical stress that the memory cells of the counter can undergo due to the programming cycles of the other pages of the memory array. To overcome this disadvantage, the above-mentioned international application provides for arranging the counter in a sector independent from the other sectors of the memory. In other terms, the floating-gate transistors of the memory cells of the counter are not connected to the bit lines of the memory array and do not receive the programming voltages applied to these bit lines.

BRIEF SUMMARY OF THE INVENTION

Therefore, the object of the present invention is to simplify the architecture of a sectored memory comprising for each sector a counter for controlling and for refreshing the pages of the sector.

To achieve this object, the present invention is based on the simple but no less inventive premise according to which the integration of a counter into each sector of a memory array is possible provided that a rule of erasing the counter that will be understood in the light of the following reasoning is complied with: when a counter according to the present invention is integrated into a sector of a memory array, the memory cells of the counter undergo the same electrical stress as the memory cells of the other pages of the memory array since they are connected to the bit lines of the sector. Now, the pages of the sector are controlled at regular intervals thanks to the counter, while the counter is not. However, erasing the counter when the maximum counting value is reached, is the equivalent of an operation of refreshing the counter since all the memory cells of the counter are erased.

Therefore, the idea of the present invention is, firstly, to integrate a counter into each sector of a memory and, secondly, to provide a management mode of the counter guaranteeing that it is erased at the end of a number of electrical stress cycles that is at the most equal to the maximum number CMAX2 of electrical stress cycles that the other pages of the sector can undergo. Namely, the entire sector is refreshed prior to or upon the counter reaching its maximum counting value. In other terms, the counting performed must be such that the maximum counting value preceding the erasure of the counter is at the most equal to the value CMAX2 defined above by the general relation (3) or the particular relation (5).

Another idea of the present invention, allowing possible malfunctions of memory cells of the counter to be overcome, is to allocate to each token a value defined by a set of memory cells, and to estimate the value of a token by determining the majority value of the bits forming the token.

Thus, the present invention provides an electrically erasable and programmable memory comprising a memory array organized in sectors, each sector comprising memory cells linked to bit lines and to word lines, the memory cells linked to a same word line forming one page of the memory array, the memory cells linked to a same bit line being subjected to an electrical stress cycle upon each programming operation of another memory cell linked to the same bit line, at least one counter for controlling and for refreshing pages of the memory array, comprising data forming tokens usable once before the counter is erased, each token corresponding by its rank in the counter to at least one address of a page to be controlled, and control and refresh means managing the counter and arranged for controlling and, if necessary, refreshing pages designated by the counter, wherein each sector comprises a control and refresh counter that is integrated into the sector and that thus comprises memory cells linked to the bit lines of the sector, and the control and refresh means are arranged for erasing a counter after reaching a maximum counting value that is chosen so that, when this maximum counting value is reached, memory cells of the counter have undergone a number of electrical stress cycles that is at the most equal to a determined number.

According to one embodiment, the determined number is the maximum number of electrical stress cycles that the pages of the corresponding sector can undergo between two controls.

According to one embodiment, the maximum counting value of a counter is chosen so that all the pages of the corresponding sector are controlled at least once between two erasures of the counter.

According to one embodiment, a token designates a determined number of pages, and the maximum counting value of a counter is equal to the maximum number of electrical stress cycles that the pages of the corresponding sector can undergo between two controls, divided by the number of pages that a token designates.

According to one embodiment, the control and refresh means are arranged for, before or after each programming cycle of a page of a sector, controlling one and only one page of the same sector.

According to one embodiment, the memory comprises means for allocating to a token of a counter a logic value that is equal to the majority logic value of a group of bits saved in a group of memory cells of the counter, the used or unused state of the token varying according to the majority logic value.

According to one embodiment, the maximum counting value covers the entire data storage extent offered by the counter, such that each memory cell of a counter receives a bit forming one token part.

According to one embodiment, a group of memory cells corresponding to one token comprises a number of memory cells equal to the ratio of the number of memory cells of the counter to the number of pages that the sector in which the counter is located comprises.

According to one embodiment, the control and refresh means are arranged for erasing a counter during the erasure of one page of the sector in which the counter is located.

According to one embodiment, the memory comprises an address converter for converting the rank of an unused token into the address of a page to be controlled.

The present invention also relates to a method for controlling and for refreshing memory cells in an electrically erasable and programmable memory comprising a memory array organized in sectors, each sector comprising memory cells linked to bit lines and to word lines, the memory cells linked to a same word line forming one page of the memory array, the memory cells linked to a same bit line being subjected to an electrical stress cycle upon each programming operation of another memory cell linked to the same bit line, the method comprising controlling and, if necessary, refreshing memory cells of pages of the memory array the address of which is indicated by a control and refresh counter comprising data forming tokens usable once before the counter is erased, each token corresponding, by its rank in the counter, to at least one address of a page to be controlled, a method wherein a control and refresh counter is integrated into each sector of the memory and comprises memory cells linked to the bit lines of the sector, and a counter of a sector is erased after reaching a maximum counting value that is chosen so that, when this maximum counting value is reached, memory cells of the counter have undergone a number of electrical stress cycles that is at the most equal to a determined number.

According to one embodiment, the determined number is the maximum number of electrical stress cycles that the pages of the corresponding sector can undergo between two controls.

According to one embodiment, the maximum counting value of a counter is chosen so that all the pages of the corresponding sector are controlled at least once between two erasures of the counter.

According to one embodiment, a token designates a determined number of pages, and the maximum counting value of a counter is equal to the maximum number of electrical stress cycles that the pages of the corresponding sector can undergo between two controls, divided by the number of pages that a token designates.

According to one embodiment, a page of a sector is controlled before or after each programming operation of a page of the same sector.

According to one embodiment, the used or unused state of a token of a counter is determined by the majority logic value of a group of bits saved in a group of memory cells of the counter.

According to one embodiment, the maximum counting value of a counter covers all the memory cells of the counter, such that tokens are saved in all the memory cells of the counter.

According to one embodiment, a counter is erased during the erasure of a page of the sector in which the counter is located.

BRIEF DESCRIPTION OF THE SEVERAL VIEWS OF THE DRAWING(S)

These and other objects, features and advantages of the present invention shall be explained in greater detail in the following description of various examples of implementation of the method according to the present invention in two memories having different architectures, given in relation with, but not limited to the following figures.

DETAILED DESCRIPTION OF THE INVENTION

Figure 1:
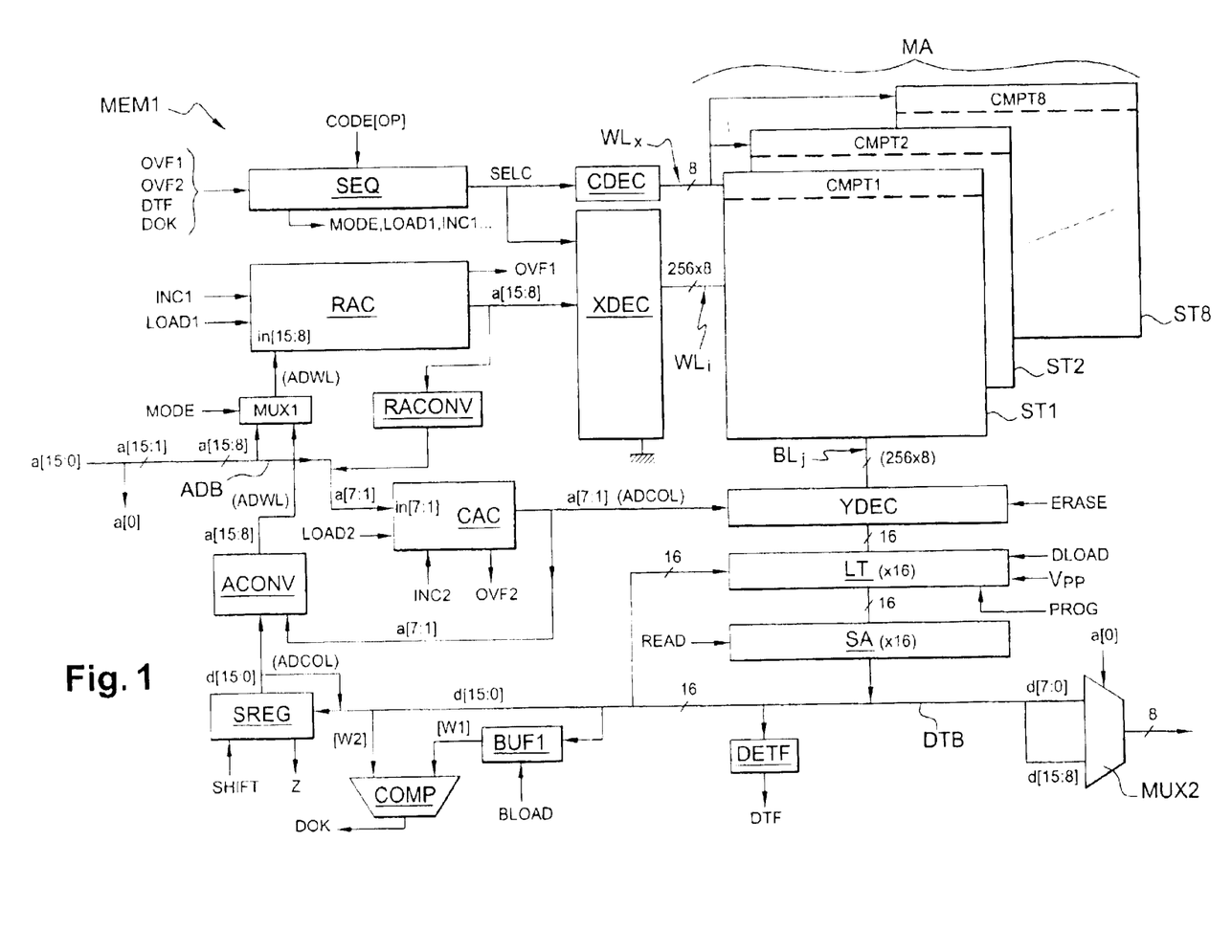
FIG. 1 represents in block form a Flash memory with 8 data bits comprising means for implementing the method according to the present invention.

FIG. 1 represents in block form a memory MEM1 in which a method for controlling and refreshing memory cells according to the present invention is implemented. The memory MEM1 comprises a memory array MA of Flash type broken down into sectors STk (k being an index), here eight sectors ST1, ST2 . . . ST8 isolated from each other by the triple-well technique. Each sector STk has 256 word lines $WL_i$ each comprising 256 words of eight bits, or bytes, i.e., 2,048 bit lines $BL_j$ (256×8). In addition to these 256 word lines, each sector comprises one special word line WLx forming a counter CMPTk according to the present invention, i.e., eight word lines WLx in total corresponding to the counters CMPT1, CMPT2, . . . CMPT8. The memory thus has 2,048 pages in total (excluding counters) spread over the eight sectors and offers a storage capacity of 4 Mbits.

Figure 2:
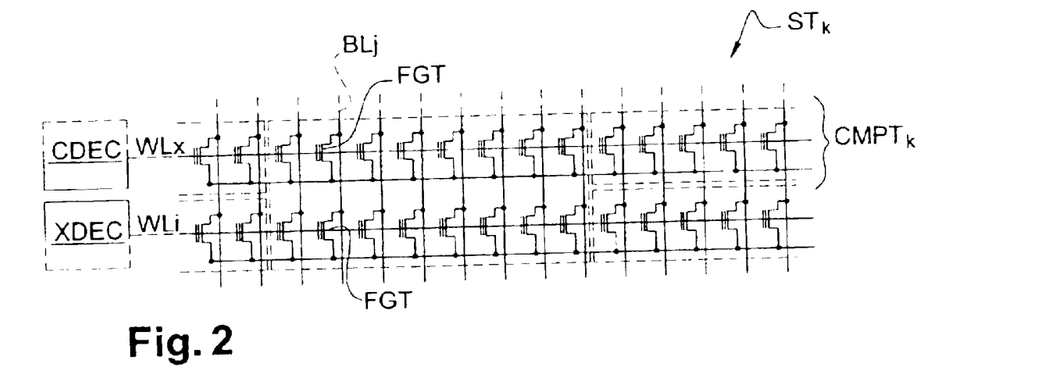
FIG. 2 is a partial view of a sector of the memory in FIG. 1.

FIG. 2 is a partial view of a sector STk. The memory cells of the counter CMPTk integrated into this sector are formed by floating-gate transistors FGT that are linked on the one hand by their gates to the special word line WLx, and are linked on the other hand by their drains to the bit lines $BL_j$ of the sector. Beneath the word line WLx, a normal word line WLi of the sector can be distinguished, to which the gates of the floating-gate transistors of one page of the sector are linked. Therefore, each memory cell of the counter is linked to one bit line $BL_j$ and undergoes a cycle of the same electrical stress when a memory cell linked to this bit line $BL_j$ is programmed, since it receives a programming voltage applied to the bit line.

Each counter CMPTk thus comprises 2,048 bits here, i.e., 256 columns of eight bits each, and is dedicated to managing the addresses of word lines to be controlled in accordance with the method described in application WO 02/41322. The maximum time of electrical stress TMAX2 that a memory cell can undergo is given by the relation (4) described above. In the following description, the parameters R and K are chosen equal to 1, such that one page is controlled in a sector after each programming operation of a page of this sector.

The maximum time of electrical stress TMAX2 that a memory cell can undergo is in this case given by the relation (6).

According to the present invention, each counter is managed so as to be erased after undergoing a number of electrical stress cycles that is at the most equal to the maximum number of electrical stress cycles CMAX2 that one memory cell of the sector can undergo, as defined by the relations (3) and (5). In these conditions, the electrical stress that the memory cells undergo remains within the permissible limits, the erasure of the counter being the equivalent of refreshing the counter.

Furthermore, the tokens are formed by groups of bits and not by individual bits. The number of bits forming a token is determined here so that all the memory cells of the counter are used during a count going from the first to the last word line of a sector. As a sector here comprises 256 word lines and the counter comprises 2,048 memory cells, the number of memory cells to form a token, while using all the memory cells of the counter, is here equal to 2,048/256, i.e., 8 memory cells to form a token, i.e., again 256 tokens in each counter each allocated to the designation of one page. Generally speaking, if one sector comprises N word lines, and if the word lines of the sector comprise M memory cells, the number of memory cells forming a token of the counter is equal to M/N bits, if the full capacity of the counter is to be used. This number of tokens corresponds to controlling all the word lines of the sector, after which the counter is erased.

By applying the above-mentioned rules, a counter CMPTk is filled in the manner described by table 1 below. In this table, the data are expressed in hexadecimal notation (one character from 0 to F representing 4 bits), the reading of a memory cell in the programmed state corresponding to reading a bit on 0, and the reading of an erased memory cell corresponding to reading a bit on 1.

TABLE 1

| State of the counter | Word line WLi to be controlled |
|---|---|
| FFFFFFFFFFFF . . . FFFFFFFFFFFF | WL0 |
| 00FFFFFFFFFF . . . FFFFFFFFFFFF | WL1 |
| 0000FFFFFFFF . . . FFFFFFFFFFFF | WL2 |
| 000000FFFFFF . . . FFFFFFFFFFFF | WL3 |
| FFFFFFFFFFFF . . . FFFFFFFFFFFF | . . . |
| 000000000000 . . . 000000000FF | WL255 |

The counter is programmed byte by byte, starting with the least significant bytes, one byte representing a token and the address of the byte in the counter representing the address of a word line to be controlled. When the last byte on FF is found in the counter, this byte is set to 0 before the counter is erased. Before being erased the counter therefore has a temporary state in which all the bytes are on zero.

The means provided in the memory MEM1 for implementing the method according to the present invention will now be described.

The memory MEM1 as represented in FIG. 1 comprises a word line decoder XDEC for driving the word lines $WL_i$ of each sector, and a specific decoder CDEC for driving the special word line WLx of each counter CMPTk (CMPT1 to CMPT8). The decoder CDEC is woken up by a select signal SELC that automatically inhibits the decoder XDEC.

The memory MEM1 also comprises a column decoder YDEC, a programming register LT, a read circuit SA, a line address counter RAC, a column address counter CAC, an address bus ADB receiving an address of sixteen bits a[15:0] and a data bus DTB conveying sixteen data bits d[15:0], i.e., two bytes in parallel.

The column decoder YDEC here comprises 2,048 inputs/outputs (256×8) connected to the 2,048 bit lines of the memory array MA and sixteen inputs/outputs connected to the programming register LT and to the read circuit SA.

The register LT comprises sixteen high voltage latches (not represented) allowing two bytes in the memory array to be programmed simultaneously. The latches are connected at output to the sixteen inputs/outputs of the column decoder YDEC and are connected at input to the data bus DTB, to receive the data bits d[15:0]. The register LT saves the data bits present on the bus DTB upon receiving a signal DLOAD, and supplies a programming voltage $V_{pp}$, at its outputs (according to the values of the bits of the two bytes loaded) upon receiving a programming signal PROG, for programming memory cells.

The read circuit SA, woken up by a signal READ, here comprises sixteen sense amplifiers (not represented) connected to the sixteen inputs/outputs of the column decoder YDEC, and is connected at output to the data bus DTB.

The counter RAC ("Row Address Counter") receives at inputs in[15:0] eight most significant address bits a[15:8] present on the address bus ADB, forming a word line address ADWL, and applies them to the column decoder XDEC. The counter RAC is driven by a signal LOAD1 for loading the address bits, can be incremented by a signal INC1 and supplies a signal OVF1 in the event of address overflow. The address bits a[15:8] are applied to the counter RAC through a multiplexer MUX1 driven by a signal MODE, having one input connected to the address bus.

The counter CAC ("Column Address Counter") comprises inputs in[7:1] connected to the address bus ADB, for receiving seven least significant address bits a[7:1] forming a column address ADCOL. The output of the counter CAC applies the column address ADCOL to the address input of the decoder YDEC. The counter CAC is driven by a load signal LOAD2, by an increment signal INC2, and supplies a signal OVF2 equal to 1 when it reaches the last column address.

The least significant address bit a[0] present on the address bus ADB is applied to a select input of a multiplexer MUX2 receiving at a first input the first byte d[7:0] present on the data bus and at a second input the second byte d[15:8] present on the data bus. The output of the multiplexer MUX2 supplies the byte d[7:0] or the byte d[15:8] according to the value of the address bit a[0].

The memory MEM1 also comprises an address converter ACONV, a reciprocal address converter RACONV, a 16-bit parallel input/output shift register SREG, a logic detector DETF, a buffer BUF1, a logic comparator COMP and a sequencer SEQ.

The register SREG has a parallel input connected to the data bus DTB and a parallel output connected to one input of the converter ACONV and to the data bus DTB. The register SREG is driven by a shift signal SHIFT and supplies a signal Z equal to 1 when it only contains bits on 0.

The detector DETF is a hard-wired logic circuit connected at input to the data bus DTB and receiving the data bits d[15:0] forming two bytes. It supplies a signal DTF equal to 1 when at least one byte out of the two is equal to FF (i.e., "11111111").

Advantageously, the detector DETF is arranged for setting the signal DTF to 1 when the number of bits on 1 is the majority in a byte analyzed. For each byte, the majority value is for example determined on two groups GP1, GP2 of four bits each, according to the following logic equations:

$GP1=(d0.d1+d2).(d3+d0.d1.d2).(d0+d1)$.

$GP2=(d4.d5+d6).(d7+d4.d5.d6).(d4+d5)$.

A byte is considered to be equal to FF if each of the groups GP1, GP2 is equal to F, which means that two faulty memory cells out of eight memory cells forming a token is tolerated, if the two faulty memory cells belong to different groups.

The signal DETF then goes to 1 if at least one of the two bytes is equal to FF, i.e.:

$DETF=(GP1.GP2)_{[byte1]}+(GP1.GP2)_{[byte2]}$.

This majority bit detection allows the value of the tokens to be immunized against defects or malfunctions affecting memory cells of the counter, the probability of these malfunctions being greater with the present invention than in the embodiment described by application WO 02/41322, since the memory cells of each counter undergo the same electrical stress as any memory cell of the memory array.

The buffer BUF1 has one input connected to the bus DTB and one output linked to one input of the comparator COMP, the other input of which is linked to the bus DTB. The buffer BUF1 saves a sixteen-bit word W1 (double byte) upon receiving a load signal BLOAD, and the comparator COMP supplies a signal DOK ("Data OK") when a word W2 present on the data bus DTB is identical to the word W1 present at the output of the buffer BUF1.

The address converter ACONV receives at a first input the data bits d[15:0] present on the bus DTB, and at a second input the address bits a[7:1] present at the output of the counter CAC, forming a column address ADCOL. The address converter ACONV supplies address bits a[15:8] forming a word line address ADWL, that is supplied to the counter RAC through a second input of the multiplexer MUX1.

Finally, the hard-wired logic or microprocessor sequencer SEQ supplies all the control signals described above and receives all the signals transmitted by the elements described above.

The memory MEM1 operates classically during operations of reading, of writing or of erasing pages of the memory array, the operations to be performed being sent to the sequencer in the form of operation codes CODE[OP]. The signal MODE is on 1 and the multiplexer MUX1 connects the address bus ADB to the inputs in[15:8] of the counter RAC. When a page must be programmed in a sector STk, the address of the page is applied to the counter RAC via the address bus. The programming of the page is preceded by an erasure of the page. The data to be programmed are then saved in pairs of bytes in the register LT. The column counter CAC is incremented after each programming operation of a pair of bytes, until all the memory cells of the page are programmed (only the memory cells that must receive a 0 being programmed).

When a page has been programmed in a sector STk, the sequencer SEQ triggers a procedure of reading the counter CMPTk of this sector aiming to determine the address of the page that must be controlled.

The sequencer sets the signal MODE to 0, wakes up the decoder CDEC by means of the signal SELC, sets the counter CAC to zero and wakes up the read circuit SA (signal READ). The first two bytes of the counter CMPT are supplied on the data bus DTB by the read circuit SA. If the signal DTF at the output of the detection circuit DETF remains on 0, that means that the first two bytes read in the counter CMPT are zero. The sequencer thus increments the counter CAC by one unit, which corresponds here to a jump of two bytes since one electric column comprises sixteen bit lines. The sequencer reads the two next bytes of the counter on the data bus, again by means of the read circuit, and so on and so forth until the signal DTF goes to 1. When the signal DTF goes to 1, the sequencer knows that out of the two bytes read, at least one byte is equal to FF. This is the first non-zero byte of the counter CMPT corresponding to an unused token.

The bits d[7:1] of the column address ADCOL comprising the two bytes out of which at least one byte is equal to FF, are then loaded into the register SREG and find themselves at the input of the conversion circuit ACONV. The latter converts the, column address ADCOL into a word line address ADWL (bits a[15:8]). This word line address ADWL is applied to the inputs in[15:8] of the counter RAC, through the multiplexer MUX1 the second input of which has been selected by the signal MODE changing to 0.

A column address ADCOL is converted into a word line address ADWL by the address converter in accordance with the following algorithm:

if $d[15:0]$=FFFF then $ADWL=2*ADCOL$, if $d[15:0]$=00FF then $ADWL=2*ADCOL+1$.

Figure 3:
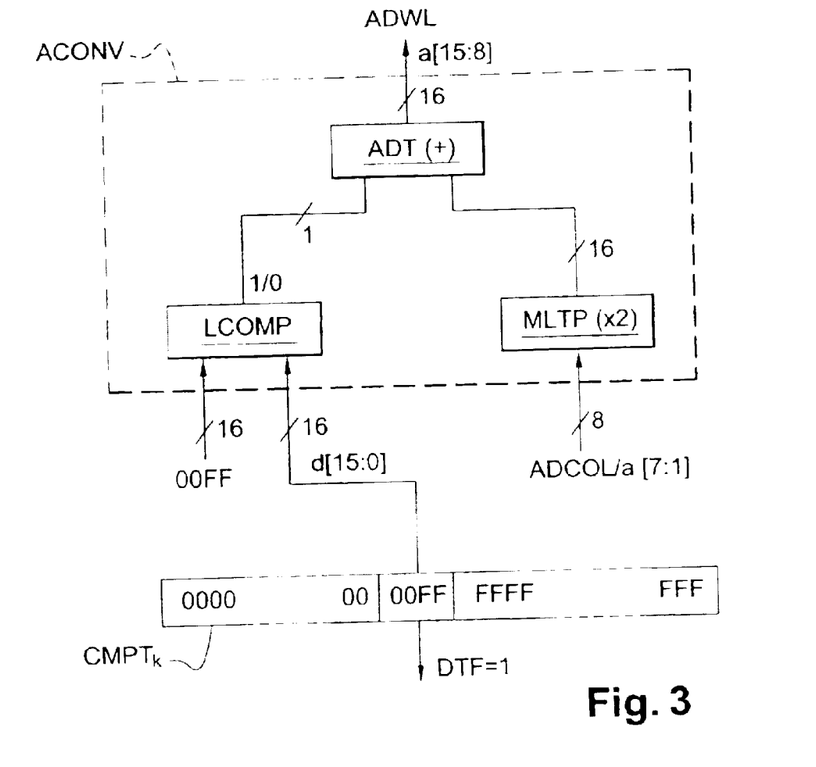
FIG. 3 is the logic diagram of an element represented in block form in FIG. 1.

FIG. 3 represents an embodiment of the address converter ACONV. A multiplier MLTP receives the address ADCOL and multiplies this address by two. The address "2*ADCOL" is applied to one input of an adder ADT the output of which supplies the word line address ADWL. Another input of the adder is linked to the output of a logic comparator LCOMP, that receives at one input a set point equal to DOFF and at the other input the data bits d[15:0] coming from the register SREG. When these data bits are equal to DOFF the output of the comparator goes to 1, otherwise the output of the comparator remains on 0. The address ADWL supplied by the adder therefore conforms to the algorithm described above.

The address ADWL is then loaded into the counter RAC and the process of controlling the page designated by this address is started. After resetting the counter CAC, the bytes of the page to be controlled are read two by two. More particularly, each pair of bytes is read by means of two different read voltages, the first being a conventional read voltage $V_{READ}$ and the second a verify voltage $V_{VRFY}$ higher than $V_{READ}$. The comparison of the bytes read by means of the two voltages $VR_{EAD}$, $V_{VRFY}$ allows the existence of at least one programmed floating-gate transistor, the threshold voltage of which has become lower than the voltage $V_{VRFY}$, to be detected.

The two bytes are compared by the comparator COMP. The pair of bytes W1 read by means of the voltage $V_{VRFY}$ is stored in the buffer BUF1 and thus finds itself at the first input of the comparator. The pair of bytes W2 read with the voltage $V_{READ}$ is left on the data bus DTB and thus finds itself at the second input of the comparator. If the signal DOK at the output of the comparator goes to 0, the sequencer knows that memory cells in the programmed state have lost electric charges. In this case, the pair of bytes W2 (that is the reference pair of bytes since it has been read with the voltage $V_{READ}$) is loaded into the programming register LT, then the sequencer triggers a programming cycle to refresh the damaged cells.

When all the bytes of the page have been controlled and the damaged memory cells, as necessary, have been reprogrammed, the sequencer increments the counter CMPT by one unit. This increment involves setting to 0 the first non-zero byte that had been found at the step of searching for the address of the page to be controlled. For that purpose, the reciprocal address converter RACONV converts the word line address a[15:8] present at the output of the counter RAC into a column address a[7:1], by executing an algorithm that is the opposite of the one described above.

When the column address is recovered by the counter CAC, the double byte comprising at least one non-zero byte is still present in the register SREG. This double byte is decremented by a right shift (signal SHIFT) and a 0 insertion from the left, i.e.:

FFFF becomes 00FF,

00FF becomes 0000.

Thus, in each of these two cases, a byte equal to FF corresponding to an unused token is transformed into a byte equal to 0 corresponding to a used token (i.e., "00" in hexadecimal notation).

The incremented value of the double byte is then loaded into the register LT via the data bus DTB, and is saved in the counter. Only the memory cells of the counter comprising a bit on 1 and in which a bit on 0 must be saved are saved, thanks to a programming control circuit that is classical per se and is not represented in FIG. 1. Therefore, during the increment process of the counter and up to its erasure, each memory cell is only programmed once.

Moreover, if the signal Z supplied by the register SREG goes to 1 after insertion of the zero byte, that means that the register SREG contains two bytes equal to 0. So, after saving the byte equal to 0 in the counter CMPT, the sequencer checks the value of the signal OVF2. If this signal is on 1, that means that the byte set to 0 in the counter was the last byte of the counter CMPT. In this case, the sequencer knows that it must erase the counter CMPT before the next control cycle of a page. Advantageously, the counter is erased simultaneously with the erasure of the next page to be programmed, since a page to be programmed is erased beforehand. As a result, the erasure of the counter is a transparent operation to the user and does not lead to any delay in a series of steps of programming pages.

Above an embodiment of the method of the present invention was described in which, in each sector, the counter is incremented after a page is controlled and refreshed, and in which a page is controlled and refreshed after a page of the sector is programmed.

In one alternative method, the counter is incremented before a page is controlled and refreshed and a page is controlled and refreshed before a page is programmed. In this case the method comprises most of the steps already described, in the following order:

E1) reading of the counter until the first pair of bytes comprising a byte equal to FF is found;

E2) loading of the double byte into the register SREG;

E3) conversion, into a word line address, of the column address present at the output of the counter CAC, by means of the address converter ACONV, and loading of the word line address into the counter RAC;

E4) increment of the double byte in the register SREG;

E5) loading of the incremented double byte into the circuit LT and programming of the counter for incrementing the counter;

E6) control and, if necessary, refreshing of the page designated by the address loaded into the counter RAC in the step E3;

E7) application of the address of the page to be programmed to the address bus;

E8-1) erasure of the page to be programmed and simultaneous erasure of the counter if the signal OVF2 supplied by the counter CAC has gone to 1 in the step E4, or E8-2) erasure of the page to be programmed without erasure of the counter if the signal OVF2 has gone to 1 in the step E4; and E9) programming of the page to be programmed, by pairs of bytes, as described above.

In this embodiment, the reciprocal address converter RACONV is no longer necessary since the counter is incremented before a page is controlled and refreshed.

In yet another alternative, the counter is incremented before a page is programmed but a page is controlled and refreshed after a page is programmed. In this case a buffer is provided for logging the column address corresponding to the first non-zero pair of bytes found in the counter, to subsequently convert it into the address of the page to be controlled.

It will be understood by those skilled in the art that various other alternative embodiments of the method according to the present invention may be made, particularly according to the architecture of the memory in which it is implemented.

Figure 4:
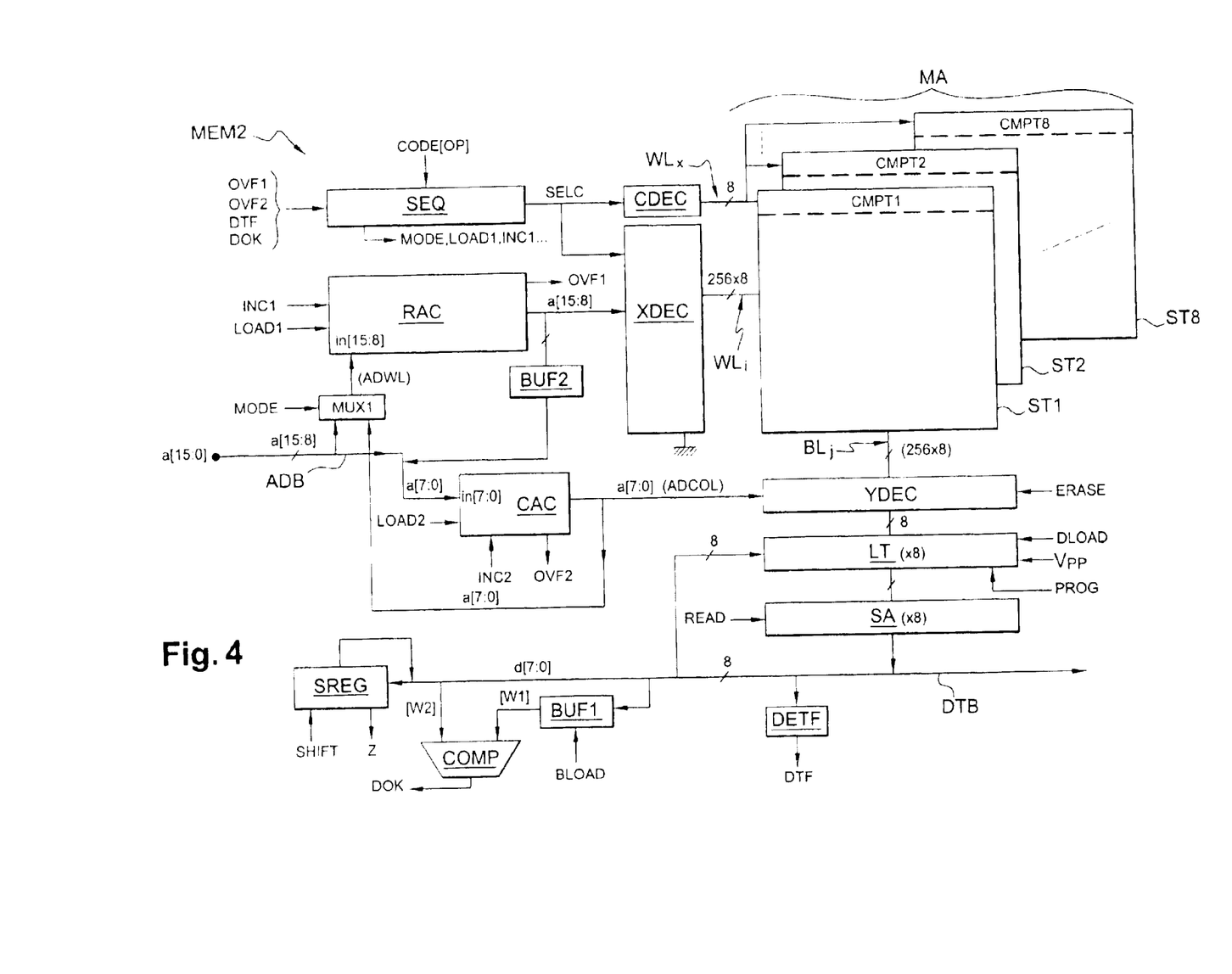
FIG. 4 represents in block form a Flash memory with 16 data bits comprising means for implementing the method according to the present invention.

As an example, FIG. 4 represents a memory MEM2 that differs from the memory MEM1 by a data bus DTB comprising eight data bits d[7:0] instead of sixteen.

The memory MEM2 comprises a memory array MA with eight sectors ST2, identical to that of the memory MEM1, each sector comprising a special word line WLx forming a counter CMPTk (CMPT1 to CMPT8). The sequencer SEQ, the word line address counter RAC, the column address counter CAC, the multiplexer MUX1, the column decoder YDEC, the programming register LT, the read circuit SA, the detector DETF, the comparator COMP and the buffer BUF1 are also found again.

The data bus DTB here comprises only eight data bits d[7:0], the read circuit SA comprises only eight sense amplifiers, the programming register LT comprises only eight high voltage latches. Also, the column decoder YDEC comprises only eight inputs/outputs connected to the programming register LT and to the read circuit SA. Finally, the detector DETF and the comparator COMP and the buffer BUF1 are 8-bit circuits.

As the electric columns comprise only eight bit lines here, the counter CAC applies to the column decoder YDEC column addresses comprising eight least significant address bits a[7:0]. For that purpose, the counter CAC here comprises eight inputs in[7:0] instead of seven, which are connected to the address bus ADB to receive the address bits a[7:0].

Therefore, upon the reading of a counter CMPTk, the column address ADCOL supplied by the counter CAC here represents the address of one and only one byte. Here, this column address corresponds to the position of a token in the counter (one token again corresponding here to eight data bits). As a result, it is no longer necessary to convert a column address into a word line address, since there is an exact correspondence between the column addresses and the word line addresses (each sector comprising 256 word lines each comprising 256 bytes, i.e., 256 electric columns of eight bit lines each).

The address converter ACONV and the reciprocal address converter RACONV are thus removed, and the column address ADCOL present at the output of the counter CAC is applied directly to the second input of the multiplexer MUX1.

When a page has been erased in a sector STk, the page control procedure conducted by the sequencer SEQ is here performed as follows. The sequencer wakes up the decoder CDEC, sets the counter CAC to zero and wakes up the read circuit SA. The counter CMPT is read byte by byte until the signal DTF goes to 1, which means that a byte equal to FF has been found.

The bits d[7:0] of the column address ADCOL of this byte are then applied as a word line address ADWL to the inputs in[15:8] of the counter RAC, through the multiplexer MUX1 and the process of controlling the page designated by this page address is triggered.

The counter CAC is then reset and the bytes of the page are read one by one to be controlled and, if necessary, refreshed in the manner described above. When all the bytes of the page have been controlled and the damaged memory cells have been reprogrammed, the sequencer increments the counter CMPT. Here, this increment also involves setting to 0 the first byte equal to FF that had been found at the step of searching for the address of the page to be controlled. For that purpose, the word line address a[15:8] present at the output of the counter RAC is applied at the input of the counter CAC as a column address a[7:0], through a buffer circuit BUF2. When the column address is recovered by the counter CAC, the non-zero byte still present in the register SREG is set to zero, is loaded into the register LT via the data bus DTB, then is saved in the counter.

It will be understood that the alternative embodiments of the method according to the present invention described above are applicable to the memory MEM2, it being possible for the counter to be incremented before a page is controlled, and it being possible for a page to be controlled before or after a page is programmed.

It will be understood that other alternatives may be provided by those skilled in the art.

Generally speaking, the maximum counting value of a counter according to the present invention can be higher than the number of word lines in a sector. If, for a better understanding, the simplified example of a sector of 8 pages (X1=8) is considered in which two pages at a time (K=2) are controlled every four cycles (R=4) of programming pages of the sector, it comes that $$CMAX2=X1*R/K=16.$$

Therefore, this counter can count up to 16 (i.e., 16 usable tokens) if one token corresponds to one and only one page, without enduring a number of electrical stress cycles higher than the number that the other pages of the sector can endure. If, on the other hand, a token is used to simultaneously designate P pages to be controlled, such as two pages (P=2) for example, by using a function table or an address converter, then the maximum counting value must not be higher than CMAX2/P, i.e., 8 if P=2.

Finally, depending on the architecture of the memory, a counter management can also be provided such that, when the maximum counting value is reached and the counter is erased, the maximum number of electrical stress cycles undergone by the memory cells of a counter is below the maximum number of stress cycles that the other memory cells of a sector can undergo.

The method for controlling and reprogramming memory cells that has just been described is particularly simple to implement and requires few material means. It is further practically transparent to the user since the time for controlling and possibly reprogramming a page is in the order of 200 µs, to be compared with the time required to erase a page beforehand, in the order of 5 ms, to which a time in the order of 1,300 µs (256×5 µs) is added for programming the 256 bytes of a page.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electrically erasable and programmable memory comprising:
   a memory array organized in sectors, each sector comprising memory cells linked to bit lines and to word lines, the memory cells linked to a same word line forming one page of the memory array, the memory cells linked to a same bit line being subjected to an electrical stress cycle upon each programming operation of another memory cell linked to the same bit line;
   at least one counter for controlling and for refreshing pages of the memory array, comprising data forming tokens usable once before the counter is erased, each token corresponding by its rank in the counter to at least one address of a page to be controlled; and
   control and refresh means for managing the counter and arranged for controlling and, if necessary, refreshing pages designated by the counter,
   characterized in that:
      each sector includes a control and refresh counter that is integrated into the sector and memory cells linked to the bit lines of the sector; and
      the control and refresh means are arranged for erasing a counter after reaching a maximum counting value that is chosen so that, when this maximum counting value is reached, memory cells of the counter have undergone a number of electrical stress cycles that is at the most equal to a determined number.

2. The memory according to claim 1 wherein the determined number is the maximum number of electrical stress cycles that the pages of the corresponding sector can undergo between two controls.

3. The memory according to claim 1 wherein the maximum counting value of a counter is chosen so that all the pages of the corresponding sector are controlled at least once between two erasures of the counter.

4. The memory according to claim 1 wherein a token designates a determined number of pages, and wherein the maximum counting value of a counter is equal to the maximum number of electrical stress cycles that the pages of the corresponding sector can undergo between two controls, divided by the number of pages that a token designates.

5. The memory according to claim 1 wherein the control and refresh means are arranged for, before or after each programming cycle of a page of a sector, controlling one and only one page of the same sector.

6. The memory according to claim 1, further comprising:
   means for allocating to a token of a counter a logic value that is equal to the majority logic value of a group of bits saved in a group of memory cells of the counter, the used or unused state of the token varying according to the majority logic value.

7. The memory according to claim 6 wherein the maximum counting value covers the entire data storage extent offered by the counter, such that each memory cell of a counter receives a bit forming one token part.

8. The memory according to claim 6 wherein a group of memory cells corresponding to one token comprises a number of memory cells equal to the ratio of the number of memory cells of the counter to the number of pages that the sector in which the counter is located comprises.

9. The memory according to claim 1 wherein the control and refresh means are arranged for erasing a counter during the erasure of one page of the sector in which the counter is located.

10. The memory according to claim 1, comprising an address converter for converting the rank of an unused token into the address of a page to be controlled.

11. A method for controlling and for refreshing memory cells in an electrically erasable and programmable memory array organized in sectors, each sector comprising memory cells linked to bit lines and to word lines, the memory cells linked to a same word line forming one page of the memory array, the memory cells linked to a same bit line being subjected to an electrical stress cycle upon each programming operation of another memory cell linked to the same bit line; the method comprising:
   controlling and, if necessary, refreshing memory cells of pages of the memory array the address of which is indicated by a control and refresh counter comprising data forming tokens usable once before the counter is erased, each token corresponding, by its rank in the counter, to at least one address of a page to be controlled;
   advancing the count on a control and refresh counter that is integrated into each sector of the memory each time memory cells linked to the bit lines of the sector undergo electrical stress cycle, and
   erasing a counter of a sector is erased after reaching a maximum counting value that is chosen so that, when this maximum counting value is reached, memory cells of the counter have undergone a number of electrical stress cycles that is at the most equal to a determined number.

12. The method according to claim 11 wherein the determined number is the maximum number of electrical stress cycles that the pages of the-corresponding sector can undergo between two controls.

13. The method according to claim 11 wherein the maximum counting value of a counter is chosen so that all the pages of the corresponding sector are controlled at least once between two erasures of the counter.

14. The method according to claim 11 wherein a token designates a determined number of pages, and wherein the maximum counting value of a counter is equal to the maximum number of electrical stress cycles that the pages of the corresponding sector can undergo between two controls, divided by the number of pages that a token designates.

15. The method according to claim 11 wherein a page of a sector is controlled before or after each programming operation of a page of the same sector.

16. The method according to claim 11 wherein the used or unused state of a token of a counter is determined by the majority logic value of a group of bits saved in a group of memory cells of the counter.

17. The method according to claim 11 wherein the maximum counting value of a counter covers all the memory cells of the counter, such that tokens are saved in all the memory cells of the counter.

18. The method according to claim 11, further including:
   erasing the counter during the erasure of a page of the sector in which the counter is located.

* * * * *